United States Patent
Kanakamedala et al.

(10) Patent No.: US 9,627,399 B2
(45) Date of Patent: Apr. 18, 2017

(54) THREE-DIMENSIONAL MEMORY DEVICE WITH METAL AND SILICIDE CONTROL GATES

(71) Applicant: SanDisk Technologies, Inc., Plano, TX (US)

(72) Inventors: Senaka Kanakamedala, Milpitas, CA (US); Raghuveer S. Makala, Campbell, CA (US); Yanli Zhang, San Jose, CA (US); Yao-Sheng Lee, Tampa, FL (US); George Matamis, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/808,229

(22) Filed: Jul. 24, 2015

(65) Prior Publication Data

US 2017/0025431 A1    Jan. 26, 2017

(51) Int. Cl.
*H01L 27/115* (2006.01)
*H01L 27/11578* (2017.01)
(Continued)

(52) U.S. Cl.
CPC .... *H01L 27/11578* (2013.01); *H01L 27/0207* (2013.01); *H01L 27/1157* (2013.01);
(Continued)

(58) Field of Classification Search
CPC ........... H01L 27/11578; H01L 27/1157; H01L 27/0207; H01L 27/1158; H01L 27/11582;
(Continued)

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

| WO | WO02/15277 A2 | 2/2002 |
| WO | WO2013/154963 A2 | 10/2013 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Galina Yushina
(74) *Attorney, Agent, or Firm* — The Marbury Law Group PLLC

(57) ABSTRACT

An alternating stack of insulating layers and sacrificial material layers is formed on a substrate. Separator insulator structures can be optionally formed through the alternating stack. Memory opening are formed through the alternating stack, and the sacrificial material layers are removed selective to the insulating layers. Electrically conductive layers are formed in the lateral recesses by deposition of at least one conductive material. Metal-semiconductor alloy regions are appended to the electrically conductive layers by depositing at least a semiconductor material and inducing reaction of the semiconductor material with the material of the electrically conductive layers and/or a sacrificial metal layer. Memory stack structures can be formed in the memory openings and directly on the metal-semiconductor alloy regions of the electrically conductive layers.

25 Claims, 15 Drawing Sheets

(51) Int. Cl.
*H01L 27/1157* (2017.01)
*H01L 29/423* (2006.01)
*H01L 29/66* (2006.01)
*H01L 29/792* (2006.01)
*H01L 27/02* (2006.01)

(52) U.S. Cl.
CPC .. *H01L 29/42344* (2013.01); *H01L 29/66833* (2013.01); *H01L 29/7926* (2013.01)

(58) Field of Classification Search
CPC .......... H01L 27/1159; H01L 27/11524; H01L 27/11529; H01L 29/42344; H01L 29/66833; H01L 29/7926; H01L 29/4234; H01L 29/4941; H01L 21/28052
See application file for complete search history.

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,303 B2 | 12/2010 | Mokhlesi et al. | |
| 7,906,392 B2 | 3/2011 | Dunton et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,349,681 B2 | 1/2013 | Alsmeier et al. | |
| 8,461,641 B2 | 6/2013 | Alsmeier et al. | |
| 8,658,499 B2 | 2/2014 | Makala et al. | |
| 8,823,076 B2 | 9/2014 | Lee et al. | |
| 8,847,302 B2 | 9/2014 | Alsmeier et al. | |
| 8,853,765 B2 | 10/2014 | Lee et al. | |
| 8,928,061 B2 | 1/2015 | Chien et al. | |
| 8,981,457 B2 | 3/2015 | Lee et al. | |
| 8,987,119 B2 | 3/2015 | Dunton et al. | |
| 9,023,719 B2 | 5/2015 | Pachamuthu et al. | |
| 9,343,358 B1* | 5/2016 | Xu | H01L 21/76877 |
| 2007/0029607 A1 | 2/2007 | Kouznetzov | |
| 2007/0210338 A1 | 9/2007 | Orlowski | |
| 2007/0252201 A1 | 11/2007 | Kito et al. | |
| 2009/0242967 A1* | 10/2009 | Katsumata | H01L 21/764 257/324 |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0171178 A1* | 7/2010 | Goswami | H01L 27/1176 257/365 |
| 2010/0181610 A1 | 7/2010 | Kim et al. | |
| 2010/0207195 A1 | 8/2010 | Fukuzumi et al. | |
| 2010/0320528 A1* | 12/2010 | Jeong | H01L 27/105 257/324 |
| 2011/0033995 A1 | 2/2011 | Katsumata et al. | |
| 2011/0076819 A1 | 3/2011 | Kim et al. | |
| 2011/0133606 A1 | 6/2011 | Yoshida et al. | |
| 2011/0156044 A1 | 6/2011 | Lee et al. | |
| 2011/0266606 A1 | 11/2011 | Park et al. | |
| 2011/0291177 A1 | 12/2011 | Lee et al. | |
| 2012/0001247 A1 | 1/2012 | Alsmeier | |
| 2012/0001249 A1 | 1/2012 | Alsmeier | |
| 2012/0001250 A1* | 1/2012 | Alsmeier | H01L 27/11551 257/319 |
| 2012/0012920 A1 | 1/2012 | Shin et al. | |
| 2012/0241846 A1* | 9/2012 | Kawasaki | H01L 29/7926 257/326 |
| 2012/0256247 A1* | 10/2012 | Alsmeier | H01L 21/764 257/319 |
| 2013/0264631 A1* | 10/2013 | Alsmeier | H01L 21/28282 257/324 |
| 2014/0175530 A1* | 6/2014 | Chien | H01L 29/66825 257/321 |
| 2014/0225181 A1 | 8/2014 | Makala et al. | |
| 2014/0293701 A1 | 10/2014 | Dong et al. | |
| 2015/0044833 A1 | 2/2015 | Lee et al. | |
| 2015/0076584 A1 | 3/2015 | Pachamuthu et al. | |
| 2015/0179660 A1 | 6/2015 | Yada et al. | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
International Search Report, International Application No. PCT/US2013/035567, Sep. 30, 2013, 6pgs.
U.S. Appl. No. 14/317,274, filed Jun. 27, 2014, SanDisk Technologies Inc.
U.S. Appl. No. 14/687,403, filed Apr. 15, 2015, SanDisk Technologies Inc.
U.S. Appl. No. 14/721,198, filed May 26, 2015, SanDisk Technologies Inc.
U.S. Appl. No. 14/734,254, filed Jun. 9, 2015, SanDisk Technologies Inc.
U.S. Appl. No. 14/748,575, filed Jun. 24, 2015, SanDisk Technologies Inc.
U.S. Appl. No. 14/748,670, filed Jun. 24, 2015, SanDisk Technologies Inc.
The International Search Report and Written Opinion of the International Searching Authority for International Application No. PCT/US2016/036086, dated Oct. 11, 2016, 13 pages.

\* cited by examiner

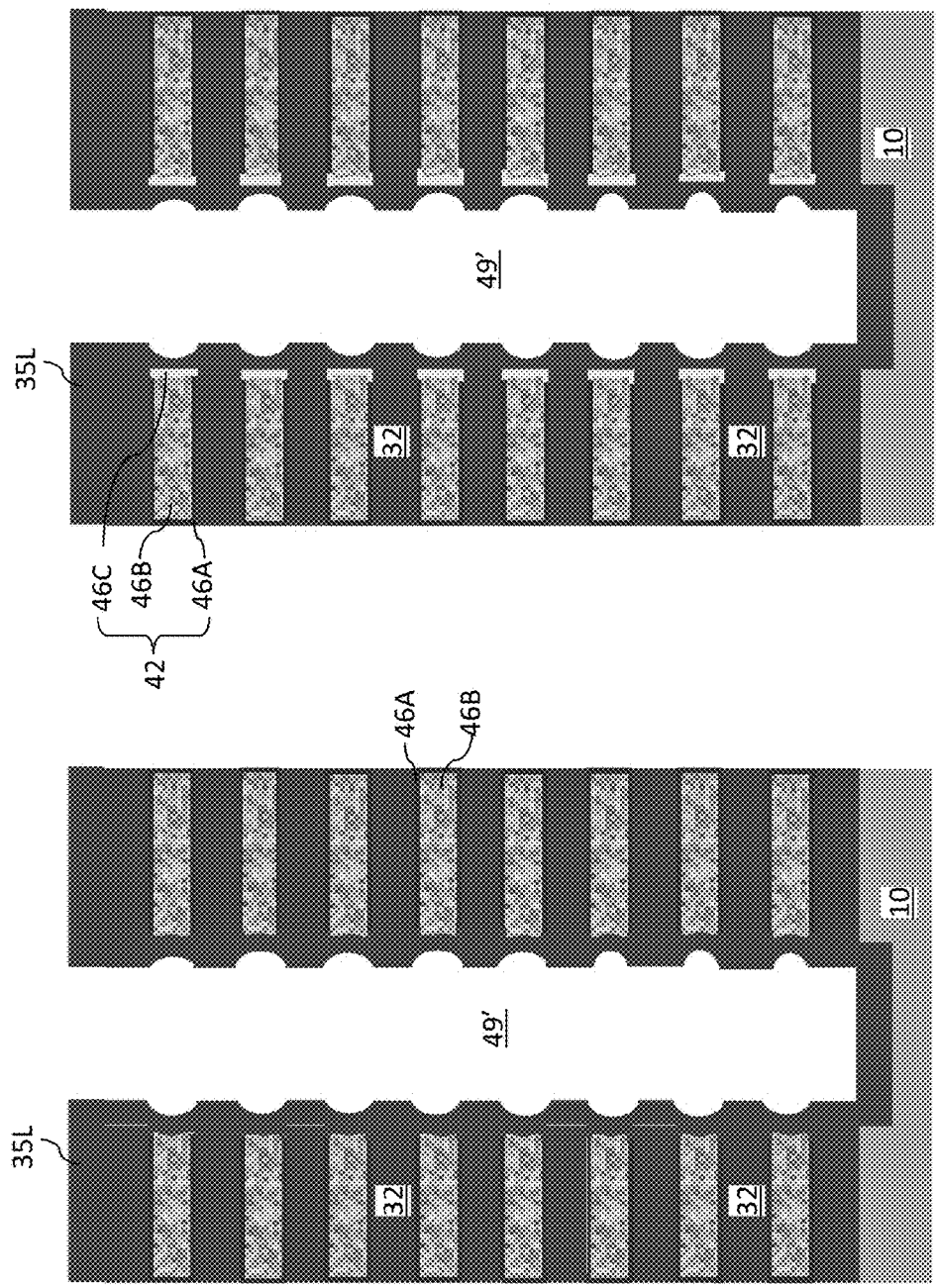

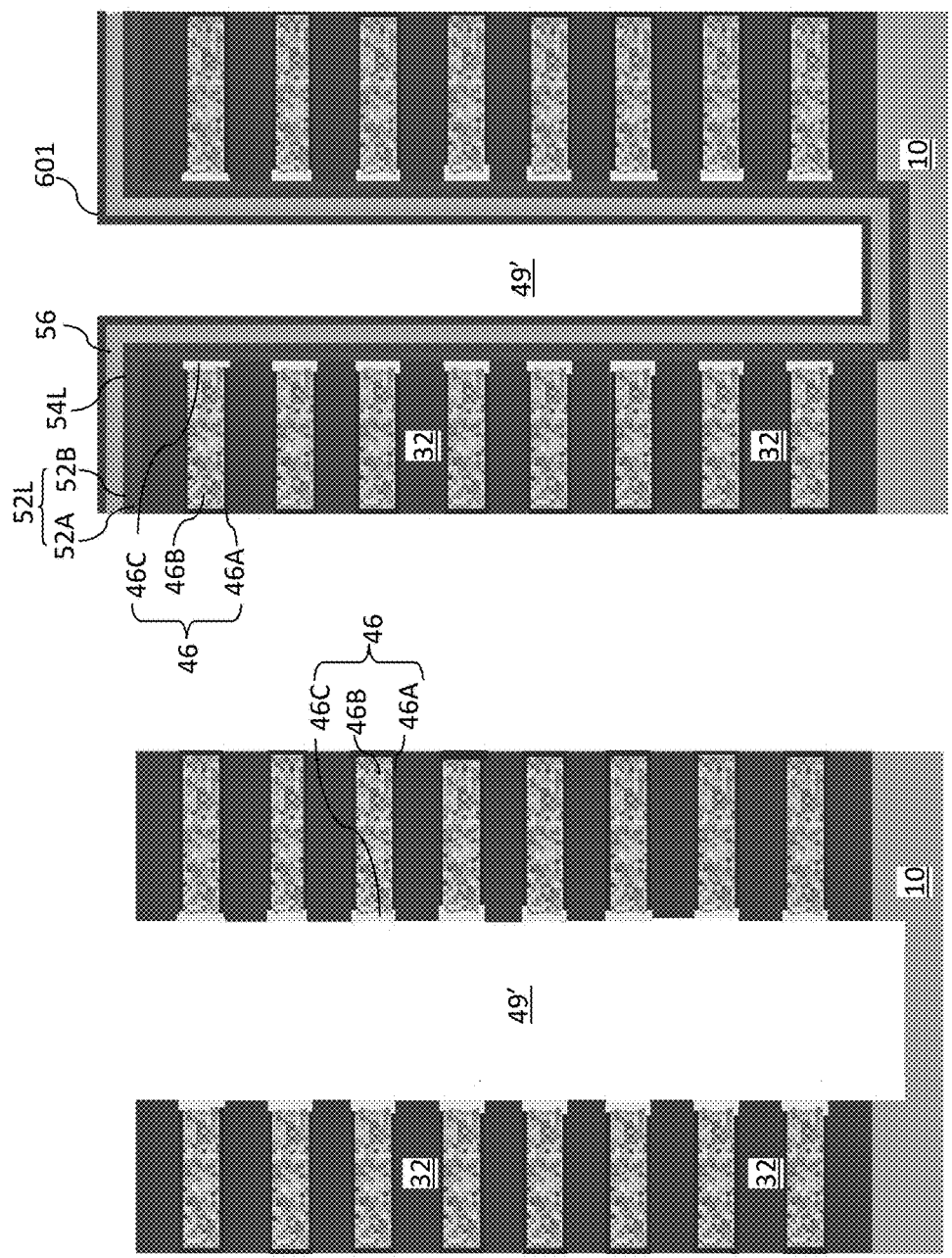

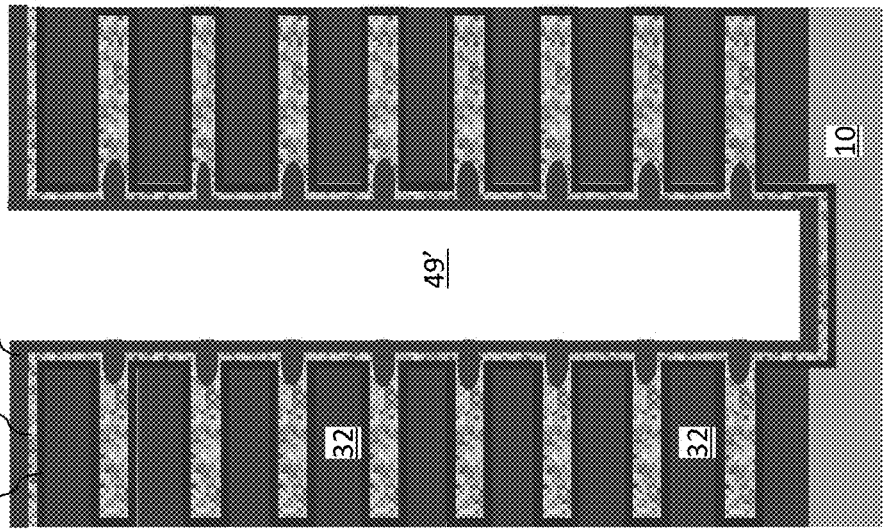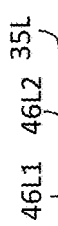
FIG. 15
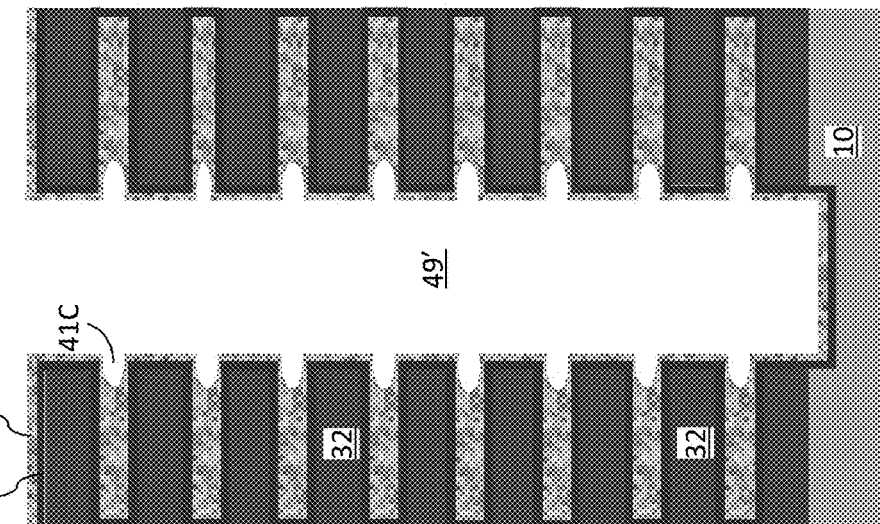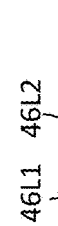
FIG. 14

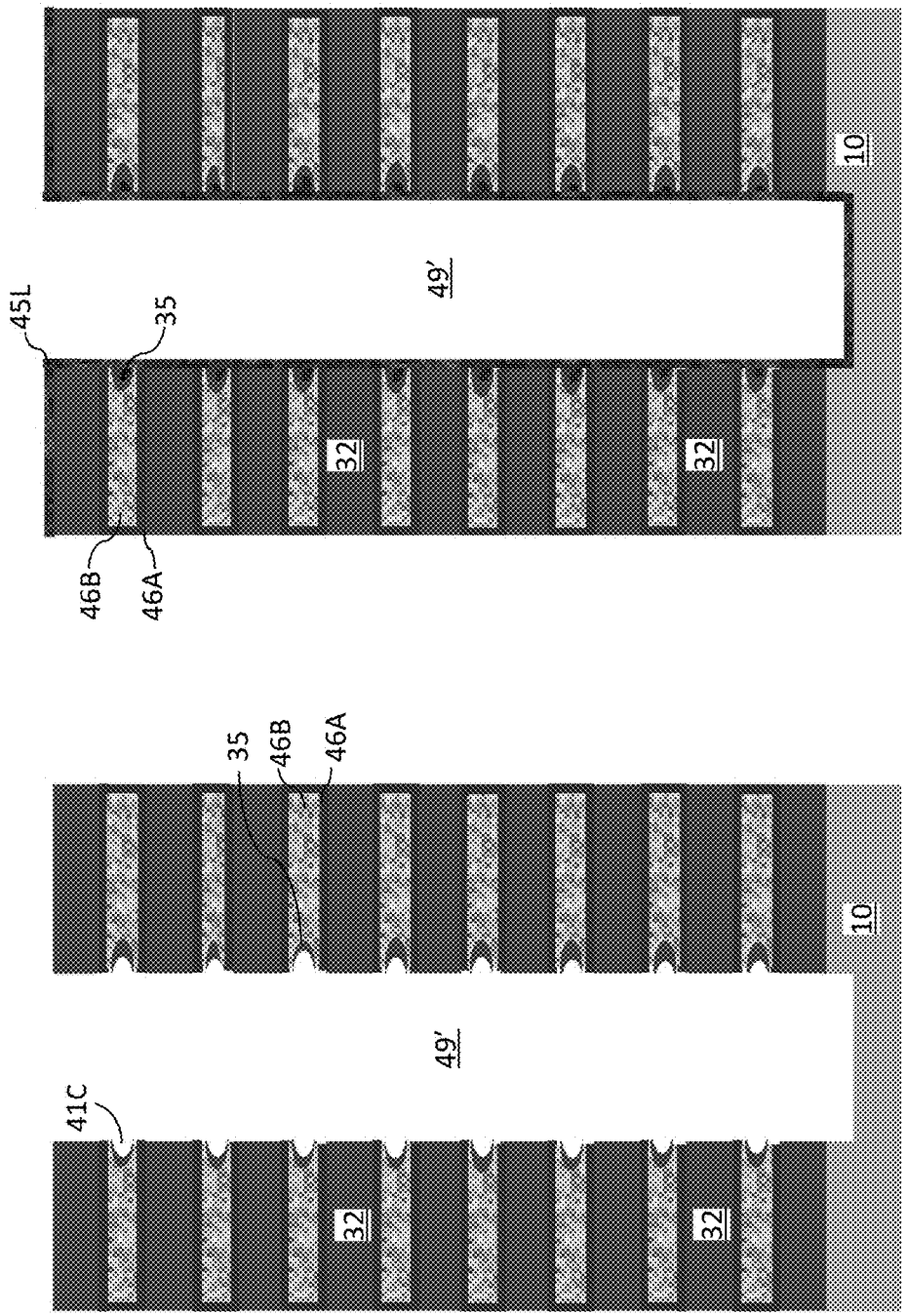

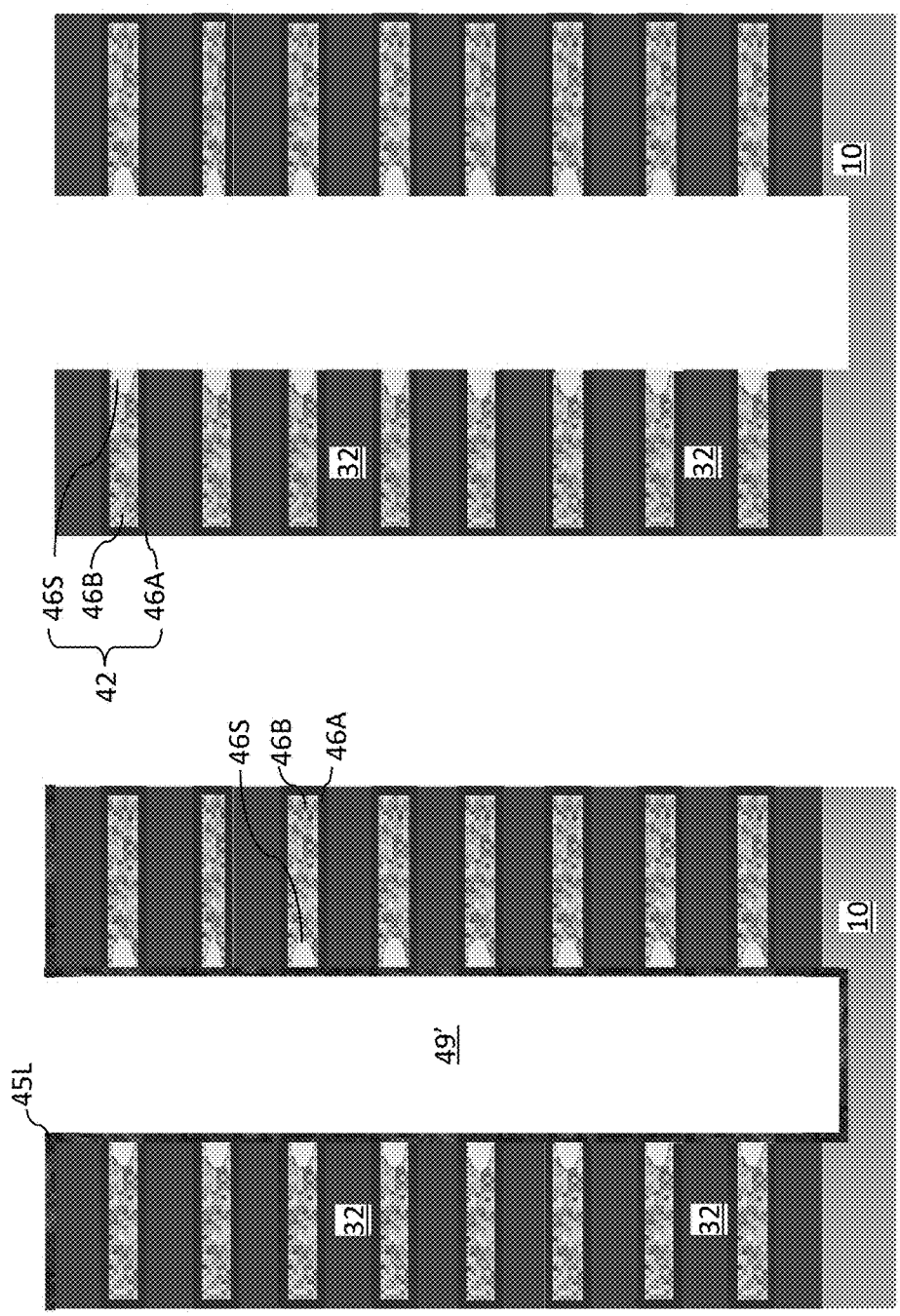

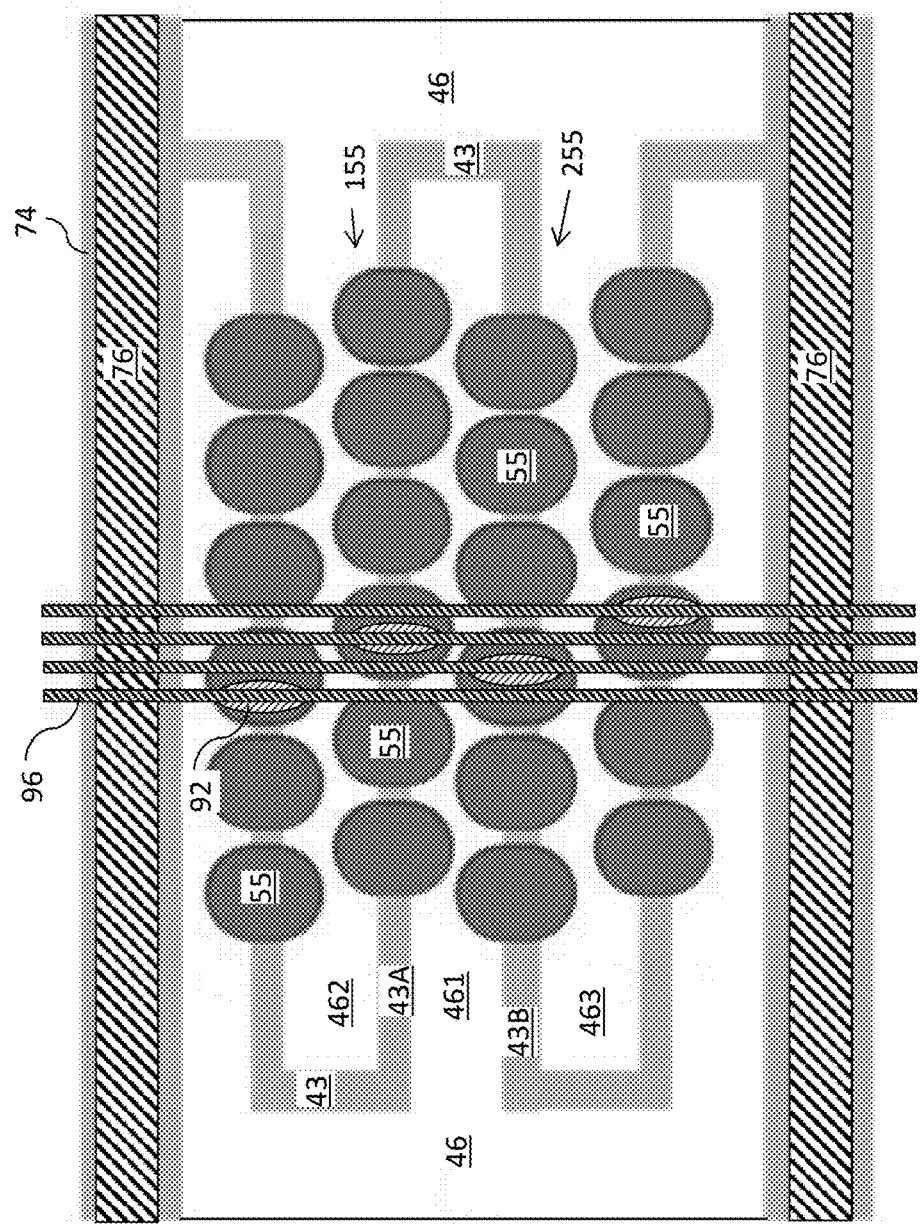

THREE-DIMENSIONAL MEMORY DEVICE WITH METAL AND SILICIDE CONTROL GATES

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a memory device comprises a stack of alternating layers comprising insulating layers and electrically conductive layers and located over a substrate, and a plurality of memory stack structures extending through the stack. Each of the electrically conductive layers comprises a control gate electrode containing a first metal region and metal-semiconductor alloy region comprising an alloy of the first metal and a semiconductor material and contacting sidewalls of the plurality of memory stack structures.

According to another aspect of the present disclosure, a method of forming a memory device comprises forming a stack of alternating layers comprising insulating layers and sacrificial material layers over a substrate, forming a plurality of memory openings through the stack, replacing the sacrificial material layers with electrically conductive layers, each of the electrically conductive layers comprising a first metal region, appending each electrically conductive layer with a metal-semiconductor alloy region, and forming a memory stack structure in each of the plurality of memory openings and directly on inner sidewalls of the metal-semiconductor alloy regions.

BRIEF DESCRIPTION OF THE DRAWINGS

FIG. 10 is a vertical cross-sectional view of the first exemplary memory opening after deposition of a sacrificial semiconductor material layer according to the first embodiment of the present disclosure.

FIG. 11 is a vertical cross-sectional view of the first exemplary memory opening after formation of metal-semiconductor alloy regions according to the first embodiment of the present disclosure.

FIG. 12 is a vertical cross-sectional view of the first exemplary memory opening after removal of the sacrificial semiconductor material layer according to the first embodiment of the present disclosure.

FIG. 13 is a vertical cross-sectional view of the first exemplary memory opening after deposition of material layers for memory films and a first semiconductor channel layer according to the first embodiment of the present disclosure.

FIG. 14 is a vertical cross-sectional view of a second exemplary memory opening after deposition of a metallic liner and a metallic fill material layer according to a second embodiment of the present disclosure.

FIG. 15 is a vertical cross-sectional view of the second exemplary memory opening after deposition of a sacrificial semiconductor material layer according to the second embodiment of the present disclosure.

FIG. 16 is a vertical cross-sectional view of the second exemplary memory opening after formation of sacrificial semiconductor material portions according to the second embodiment of the present disclosure.

FIG. 17 is a vertical cross-sectional view of the second exemplary memory opening after deposition of a sacrificial metal layer according to the second embodiment of the present disclosure.

FIG. 18 is a vertical cross-sectional view of the second exemplary memory opening after formation of metal-semiconductor alloy regions according to the second embodiment of the present disclosure.

FIG. 19 is a vertical cross-sectional view of the second exemplary memory opening after removal of the sacrificial metal layer according to the second embodiment of the present disclosure.

FIG. 25 is a see-through top-down view of the exemplary device structure that illustrates global shapes of various components of the exemplary device structure according to the embodiments of the present disclosure.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
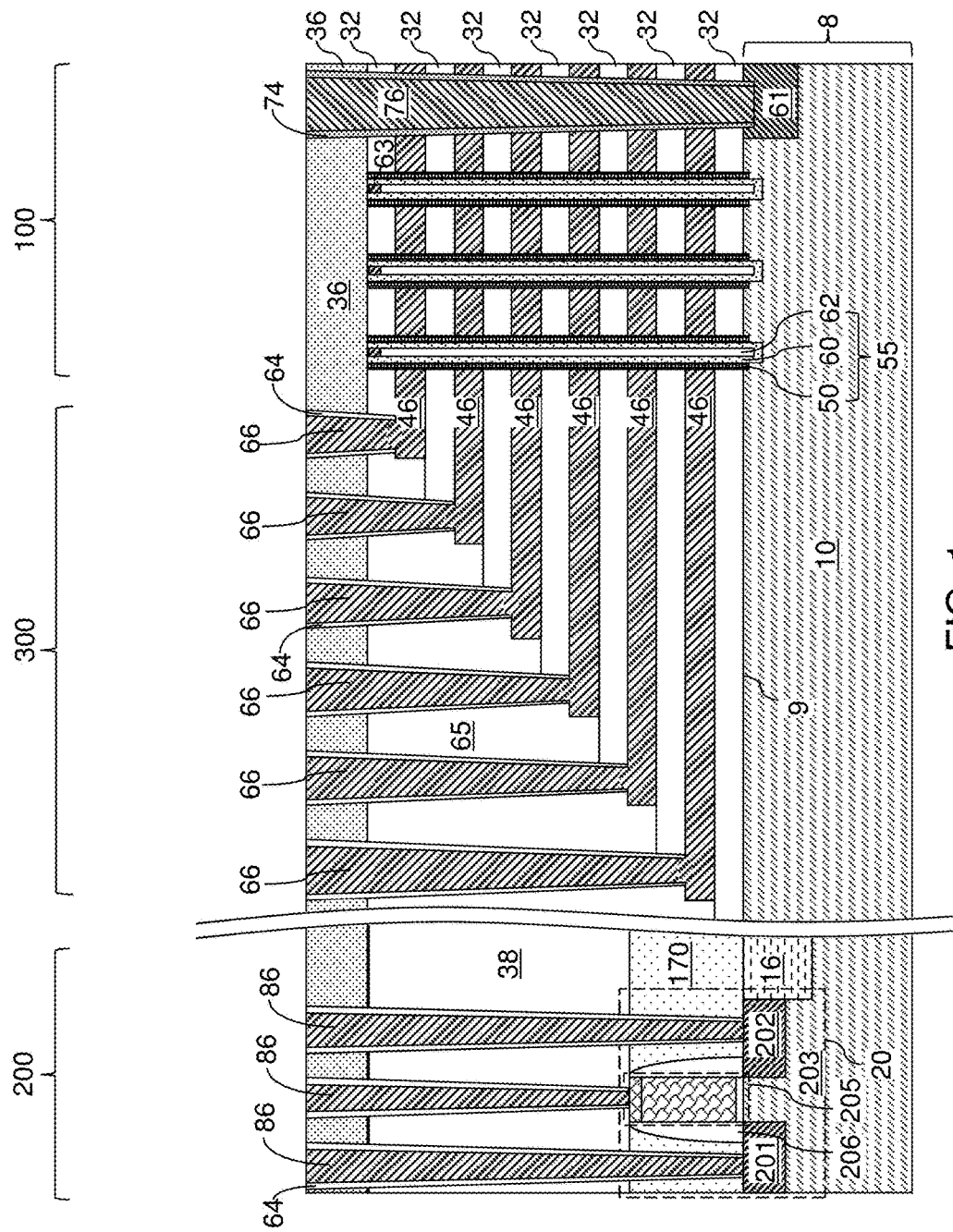
FIG. 1 is a vertical cross-section of an exemplary device structure containing a 3D NAND stacked memory device according to embodiments of the present disclosure.

Referring to FIG. 1, an exemplary device structure according to embodiments of the present disclosure is shown, which includes a 3D NAND stacked memory device. The exemplary device structure can be employed to incorporate any of the various embodiments for forming memory stack structures 55 according to the present disclosure. Each memory stack structure 55 can include at least a memory film 50, a semiconductor channel 60, and optionally a dielectric core 62 in case the semiconductor channel 60 does not fill the entire volume within the memory film 50.

The exemplary device structure includes a substrate 8, which can be a semiconductor substrate. Various semiconductor devices can be formed on, or over, the substrate 8 employing methods known in the art. For example, an array of memory devices can be formed in a device region 100, and at least one peripheral device 20 can be formed in a peripheral device region 200. Electrically conductive via contacts to the electrically conductive electrodes of the devices in the device region 100 can be formed in a contact region 300.

The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 has a major surface 9, which can be, for example, a topmost surface of the substrate semiconductor layer 10. The major surface 9 can be a semiconductor surface. In one embodiment, the major surface 9 can be a single crystalline semiconductor surface. In one embodiment, the substrate 8 is a silicon wafer containing a doped well (e.g., p-well) substrate semiconductor layer 10.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well substrate semiconductor layer 10 can be formed within the substrate 8.

Optionally, select gate electrodes (not shown) can be formed within, or on top of, the substrate semiconductor layer 10 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. A source region 61 can be formed in a region of the substrate semiconductor layer 10 that is laterally offset from the memory stack structures 55. Alternatively, a source region can be formed directly underneath memory stack structures 55 of memory cells, as described in U.S. patent application Ser. No. 14/317,274, filed on Jun. 27, 2014, which is incorporated herein by reference. A select transistor can be formed between the top of the substrate semiconductor layer 10 and the bottommost control gate of the memory devices.

At least one optional shallow trench isolation structure 16 and/or at least one deep trench isolation structure (not shown) may be employed to provide electrical isolation among various semiconductor devices on the substrate 8. The at least one peripheral device 20 formed in the peripheral device region 200 can include any device known in the art and needed to support the operation of the semiconductor devices in the device region 100. The at least one peripheral device 20 can include a driver circuit associated with the array of the memory devices in the device region 100. The at least one peripheral device can comprise transistor devices in the driver circuit. In one embodiment, the at least one peripheral device can include one or more field effect transistors, each of which can include a source region 201, a drain region 202, a body region 203 (e.g., a channel region), a gate stack 205, and a gate spacer 206. The gate stack 205 can include any type of gate stack known in the art. For example, each gate stack 205 can include, from one side to another, a gate dielectric, a gate electrode, and an optional gate cap dielectric. Optionally, a planarization dielectric layer 170 including a dielectric material may be employed in the peripheral device region 200 to facilitate planarization of the portion of material stacks to be subsequently formed on the substrate 8.

A stack of alternating layers of a first material and a second material different from the first material is formed over a top surface of the substrate 8. In one embodiment, the first material can be an insulator material that forms insulating layers 32, and the second material can be a conductive material that forms conductive line structures that can include electrically conductive layers 46, source-side select gate electrodes (not separately shown), and drain-side select gate electrodes (not separately shown). Alternatively, the first material can be an insulator material that forms insulating layers 32, and the second material can be a sacrificial material that is deposited as sacrificial layers, and is at least partly replaced with a conductive material to form various conductive line structures after formation of memory stack structures 55. In one embodiment, the alternating stack can include insulating layers 32 and material layers, which may comprise a sacrificial material that is subsequently replaced with a conductive material that forms control gate electrodes, or may comprise a conductive material that is patterned into control gate electrodes of a memory device.

The memory stack structures 55 can be formed through the alternating stack (32, 46) of the insulating layers 32 and the electrically conductive layers 46 employing the various methods of the present disclosure to be described below. A drain region 63 can be formed on top of each semiconductor channel 60. A peripheral region dielectric layer 64 can be formed by removing a peripheral portion of the alternating stack of insulating layers 32 and sacrificial material layers 42 (shown in FIG. 2B and described below) from a peripheral device region 200 including the peripheral devices (such as driver circuits) and depositing a dielectric material over the planarization dielectric layer 170. Another portion of the alternating stack (32, 42 or 46) in a contact region 300 can be removed to form stepped surfaces in which the lateral extent of the material layers (such as sacrificial material layers 42 or electrically conductive layers 46) decreases with the vertical distance from the substrate 8. A retro-stepped dielectric fill portion 65 may be optionally employed over the stepped surfaces. As used herein, a retro-stepped structure refers to a structure in which the horizontal vertical cross-sectional area changes stepwise with a vertical distance from a top surface of a substrate such that a vertical cross-sectional area of the structure at a lower horizontal plane is included in vertical cross-sectional areas of the structure at an overlying horizontal plane. Another portion 38 of the dielectric fill may be formed in region 200 at the same time as the portion 65 is formed in region 300.

A contact via trench is formed through the alternating stack (32, 42) at locations of a backside contact via structure 76 to be subsequently formed. If the material layers between vertically neighboring pairs of insulating layers 32 are sacrificial material layers 42, then the sacrificial material layers 42 can be removed by introducing an etchant through the contact via trench. The etchant removes the material of the sacrificial material layers 42 selective to the material of the insulating layers 32 to form backside recesses. Electrically conductive layers 46 can be formed by depositing at least one conducive material in the backside recesses. The electrically conductive layers 46 include control gate electrodes for the memory stack structures 55. The electrically conductive layers 46 can form terraced (stepped) structures within the contact region 300 in order to facilitate formation of contact via structures 66.

The contact via structures 66 can be formed by forming via cavities that extend to the stepped surfaces of the electrically conductive layers 46, and by filling each via cavity with an optional dielectric liner 64 and a contact via structure 66. The dielectric liner 64, if present, may enhance electrical isolation of the contact via structures 66. A hard mask layer 36 may be optionally employed to facilitate formation of the contact via structures 66. Peripheral contact via structures 86 can be formed in the peripheral device region 200. A backside contact via structure 76 (e.g., source electrode/source local interconnect) can be formed through the alternating stack (32, 46) to provide electrical contact to the source region 61. A dielectric spacer 74 can be employed to provide electrical isolation for the backside contact via structure 76. Subsequently, contacts (not shown) to the drain regions 63 can be formed, and bit lines (not shown) that overlie, and electrically shorted to, the drain regions 63 can be formed.

Figure 2A:
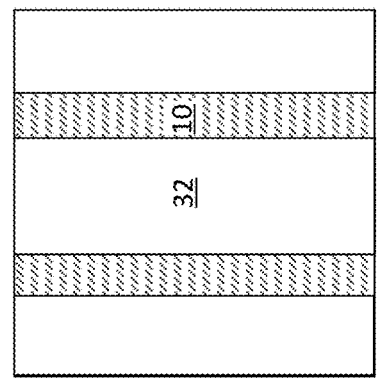
FIG. 2A is a top-down view of an array region of an exemplary device structure after formation of laterally-extending trenches according to an embodiment of the present disclosure.
Figure 2B:
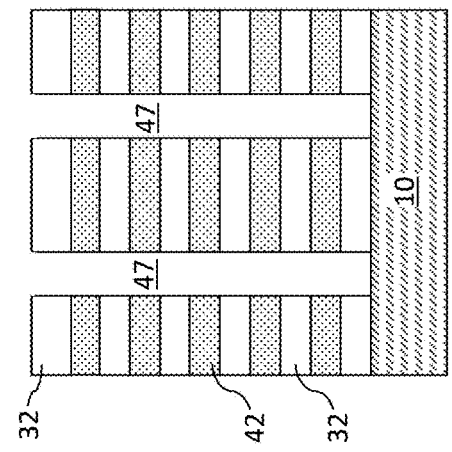
FIG. 2B is a vertical cross-sectional view of the exemplary device structure of FIG. 2A.

Referring to FIGS. 2A and 2B, a cut-out portion of a memory region 100 (e.g., memory array region) of an exemplary device structure is illustrated during a processing step employed to form the exemplary structure of FIG. 1 according to an embodiment of the present disclosure. An alternating stack (32, 42) of insulating layers 32 and sacrificial material layers 42 is formed over a substrate 8.

Electrically insulating materials that can be employed for the insulating layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. The sacrificial material layers 42 comprise sacrificial layers, such as silicon nitride or polysilicon sacrificial layers. In an illustrative example, the insulating layers 32 can include silicon oxide and the sacrificial material layers 42 can be silicon nitride layers that can be subsequently removed, for example, by a wet etch employing phosphoric acid.

Separator trenches 47 can be optionally formed through the alternating stack (32, 42) of insulating layers 32 and sacrificial material layers 42. The separator trenches 47 can be formed, for example, by application and patterning of a photoresist layer over the alternating stack (32, 42), and transfer of the pattern in the patterned photoresist layer through the alternating stack (32, 42) to the top surface of the substrate 8 that is located at the bottom of the alternating stack (32, 42). The separator trenches 47 laterally extend along a horizontal direction. In one embodiment, the separator trenches 47 can have a substantially uniform width, and can be parallel among one another. The separator trenches 47 can laterally divide the alternating stack (32, 42) into a plurality of portions. The pattern of the separator trenches 47 can be the same as the pattern of the separator insulator structures to be subsequently formed.

Figure 3A:
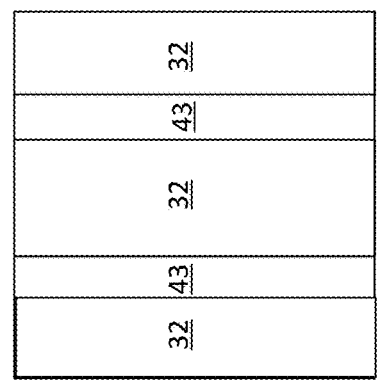
FIG. 3A is a top-down view of the array region of the exemplary device structure after formation of separator insulator structures according to an embodiment of the present disclosure.
Figure 3B:
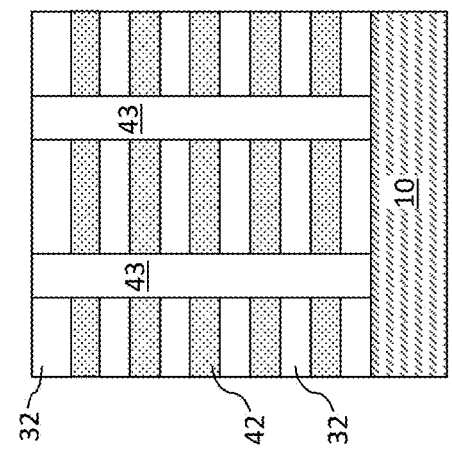
FIG. 3B is a vertical cross-sectional view of the exemplary device structure of FIG. 3A.

Referring to FIGS. 3A and 3B, in case the separator trenches 47 are formed in the preceding processing step, each separator trench 47 can be filled with a dielectric material that is different from the second material of the sacrificial layers 42. The dielectric material that fills the separator trenches 47 is herein referred to as a separator insulating material. For example, the separator insulating material can be undoped silicate glass or doped silicate glass when sacrificial layers comprise silicon nitride. Excess portions of the separator insulating material can be removed from above the top surface of the alternating stack, for example, by chemical mechanical planarization (CMP), a recess etch, or a combination thereof. Remaining portions of the deposited separator insulating material constitutes separator insulator structures 43. In one embodiment, the separator insulator structures 43 can laterally separate various portions of the alternating stack (32, 42). In an alternative embodiment, the processing steps of FIGS. 2A, 2B, 3A, and 3B can be omitted.

Figure 4A:
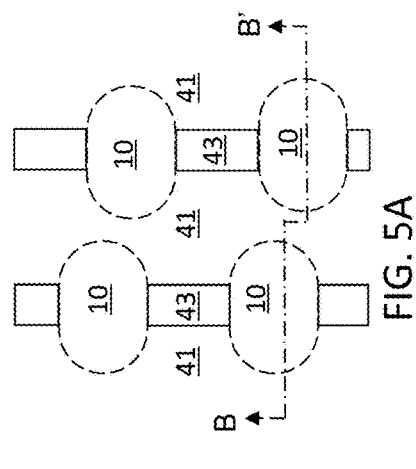
FIG. 4A is a top-down view of the array region of the exemplary device structure after formation of memory openings according to an embodiment of the present disclosure.
Figure 4B:
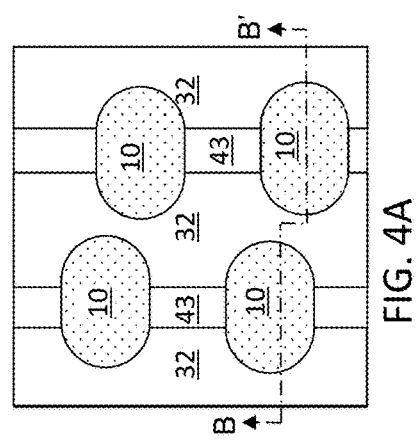
FIG. 4B is a vertical cross-sectional view of the exemplary device structure along the vertical plane B-B' of FIG. 4A.

Referring to FIGS. 4A and 4B, memory openings 49 can be formed through the alternating stack (32, 42), for example, by application of a masking layer over the alternating stack (32, 42), patterning of the masking layer, and transfer of the pattern in the masking layer through the alternating stack (32, 42) by an anisotropic etch such as a reactive ion etch. The masking layer can include a photoresist layer and optionally include an additional hard mask material layer such as a carbon layer. The masking layer can be subsequently removed, for example, by ashing. Each memory opening 49 can vertically extend from the top surface of the alternating stack (32, 42) to the top surface of the substrate that is located at the bottom of the alternating stack (32, 42). Each memory opening 49 can be located between a pair of separator insulator structures 43, which are remaining portions of the separator insulator structures as formed at the step of FIGS. 3A and 3B. In one embodiment, each memory opening 49 can divide a separator insulator structure 43 into two physically disjoined portions. In this case, each memory opening 49 in the alternating stack (32, 42) can extend through the separator insulating material located in the separator insulator structures 43, and divides a separator insulator structure 43 into two laterally disjoined portions.

Figure 5A:
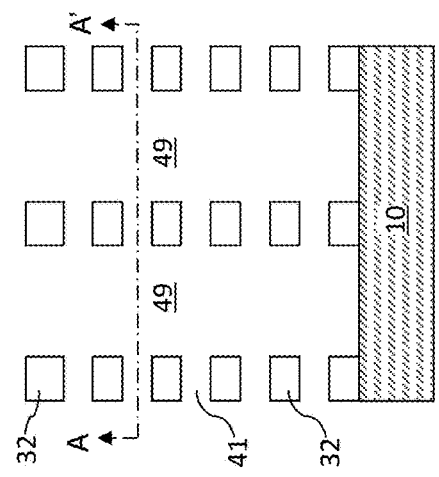
FIG. 5A is a horizontal cross-sectional view of the array region of the exemplary device structure after removal of sacrificial material layers according to an embodiment of the present disclosure.
Figure 5B:
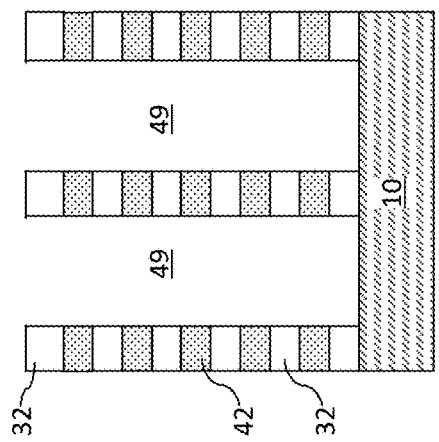
FIG. 5B is a vertical cross-sectional view of the exemplary device structure along the vertical plane B-B' of FIG. 5A. The plane A-A' corresponds to the horizontal cross-sectional plane of FIG. 5A.

Referring to FIGS. 5A and 5B, an etchant that selectively etches the second material of the sacrificial material layers 42 with respect to the first material of the insulating layers 32 can be introduced into the memory openings 49, for example, employing an etch process. Lateral recesses 41 are formed in volumes from which the sacrificial material layers 42 are removed. The removal of the second material of the sacrificial material layers 42 can be selective to the first material of the insulating layers 32, the material of the separator insulator structures 43, and the semiconductor material of the semiconductor material layer 10. In one embodiment, the sacrificial material layers 42 can include silicon nitride, and the materials of the insulating layers 32 and the separator insulator structures 43 can be selected from silicon oxide and dielectric metal oxides. In another embodiment, the sacrificial material layers 42 can include a semiconductor material such as polysilicon, and the materials of the insulating layers 32 and the separator insulator structures 43 can be selected from silicon oxide, silicon nitride, and dielectric metal oxides.

Figure 7:
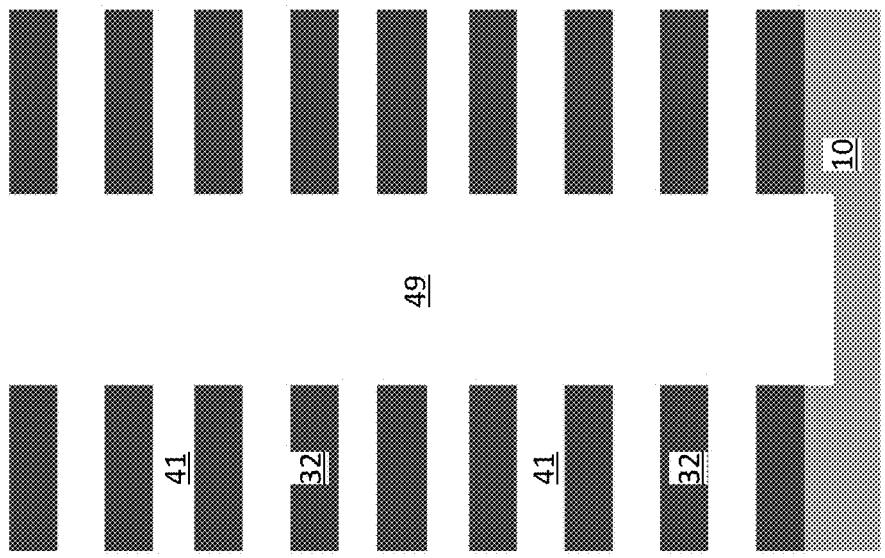
FIG. 7 is a vertical cross-sectional view of the first exemplary memory opening at the processing step of FIGS. 5A and 5B.
Figure 6:
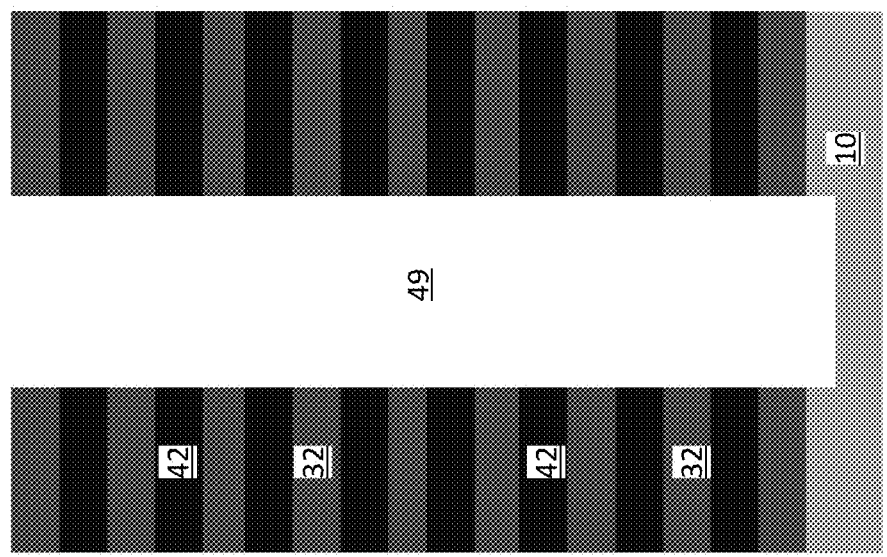
FIG. 6 is a vertical cross-sectional view of a first exemplary memory opening at the processing step of FIGS. 4A and 4B.

FIG. 6 is a vertical cross-sectional view of a first exemplary memory opening 49 at the processing step of FIGS. 4A and 4B. Subsequently, the processes of FIGS. 5A and 5B can be subsequently performed form lateral recesses 41 by removing the sacrificial material layers 42 as illustrated in FIG. 7.

Figure 8:
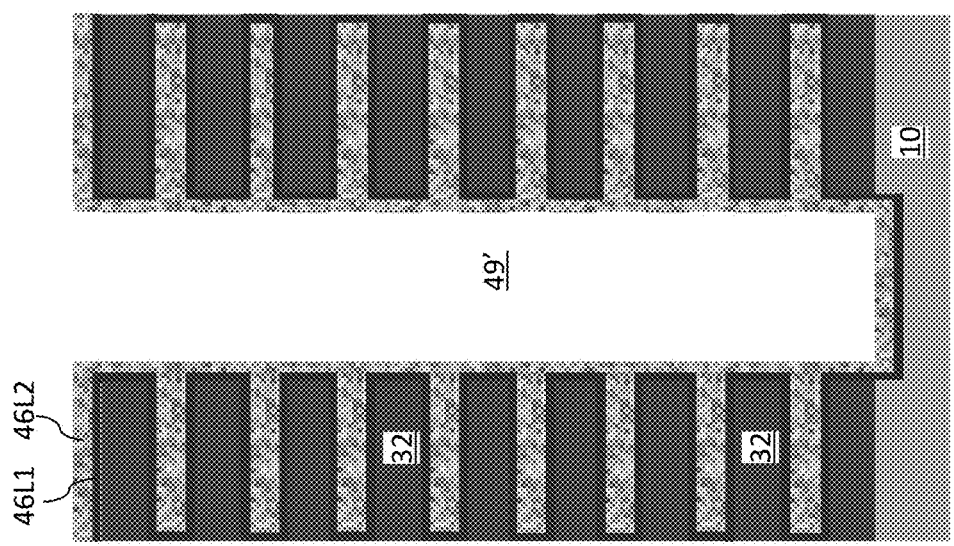
FIG. 8 is a vertical cross-sectional view of the first exemplary memory opening after deposition of a metallic liner layer and a metallic fill material layer according to a first embodiment of the present disclosure.

Referring to FIG. 8, at least one conductive material layer (46L1, 46L2) is deposited by a conformal deposition method. For example, a metallic liner layer 46L1 and a metallic fill material layer 46L2 can be sequentially deposited to completely fill the lateral recesses 41.

The metallic liner layer 46L1 includes a conductive material, which can be, for example, a conductive barrier material. In one embodiment, the conductive liner layer 46L1 can include a material such as a conductive metal nitride (e.g., TiN, TaN, or WN), a conductive metal carbide (TiC, TaC, or WC), and a stack including at least one conductive metal nitride and at least one conductive metal carbide. In one embodiment, the conductive liner layer 46L1 can comprise TiN. The thickness of the metallic liner layer 46L1 can be in a range from 1.5 nm to 6 nm, although lesser and greater thicknesses can also be employed.

The metallic fill material layer 46L2 includes a conductive material such as at least one metal. For example, the metallic fill material layer 46L2 can include at least a first metal such as tungsten, cobalt, ruthenium, copper, nickel, titanium, tantalum, and combinations thereof. The metallic fill material layer 46L2 may include an elemental metal (i.e., the first metal in an elemental form without combining with another metal or a non-metallic element), or may include an alloy of at least two metallic elements (which include the first metal and at least another metal). In one embodiment, the metallic fill material layer 46L2 can include tungsten. The metallic fill material layer 46L2 can completely fill remaining volumes of the lateral recesses, and partially fills each memory opening. Because the memory openings 49 are not completely filled with the at least one conductive material layer (46L1, 46L2), a cavity 49' is present within each memory opening 49.

Figure 9:
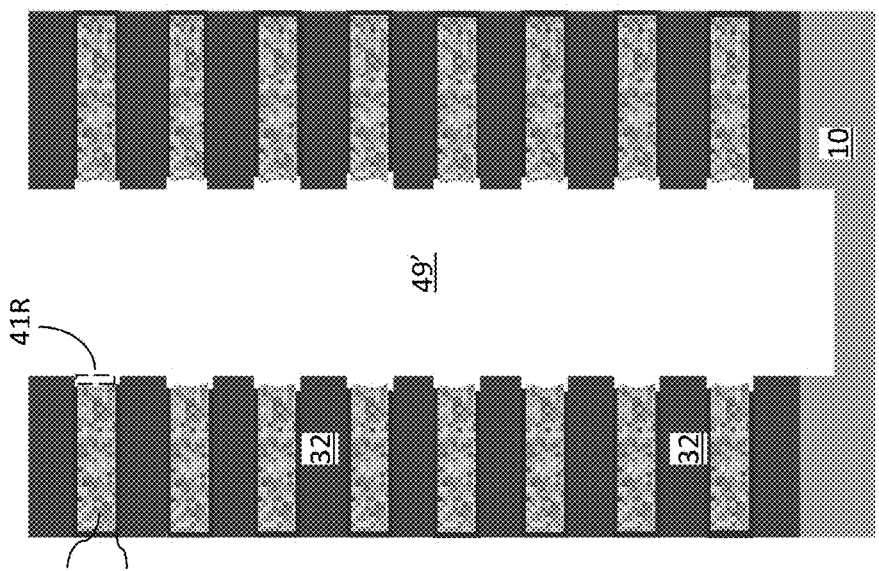
FIG. 9 is a vertical cross-sectional view of the first exemplary memory opening after removal of portions of the metallic fill material layer and the metallic liner from inside the memory opening and from above the alternating stack according to the first embodiment of the present disclosure.

Referring to FIG. 9, an etch can be performed to remove physically exposed portions of the metallic fill material layer 46L2 and the metallic liner layer 46L1. The metallic fill material layer 46L2 and the metallic liner layer 46L1 are removed from inside the memory opening 49 and from above the alternating stack of insulator layers 32. The etch may be an isotropic etch, an anisotropic etch, or a combination of anisotripic and isotropic etch steps. Each remaining portion of the metallic liner layer 46L1 at a level of a lateral recess 41 is herein referred to as a metallic liner 46A, and each remaining portion of the metallic fill material layer 46L2 within a lateral recess 41 is herein referred to as a metallic fill material portion 46B.

Each physically adjoining pair of a metallic liner 46A and a metallic fill material portion 46B constitutes an electrically conductive layer (46A, 46B). Thus, the sacrificial material layers 42 are replaced with electrically conductive layers (46A, 46B). Each of the electrically conductive layers (46A, 46B) comprises a metallic liner 46A and a metallic fill material portion 46B comprising at least one metal (which includes the first metal). Optionally, an overetch may be performed during the etching of the metallic fill material layer 46L2 and the metallic liner layer 46L1 to laterally recess sidewalls of the metallic liners 46A and the metallic fill material portions 46B. In this case, the metallic fill material portions 46B and the metallic liners 46A can be formed with sidewalls that are laterally recessed relative to sidewalls of the insulator layers 32 around each memory opening. In one embodiment, the sidewalls of the metallic fill material portions 46B may have substantially vertical sidewalls. In another embodiment, the sidewalls of the metallic fill material portions 46B may have concave sidewalls. The concavity of the sidewalls of the metallic fill material portions 46B can depend on the severity of seams in the metallic fill material layer 46L2 formed within the lateral recesses 41, and on the chemistry of the isotropic and/or anisotropic etch that is employed to recess the metallic fill material layer 46L2.

Referring to FIG. 10, a sacrificial semiconductor material layer 35L can be deposited in the memory openings 49' and over the alternating stack (32, 46A, 46B) and in recesses 41R in contact with the metallic fill material portions 46B. The sacrificial semiconductor material layer 35L can be deposited directly on the sidewalls of the electrically conductive layers (46A, 46B). The sacrificial semiconductor material layer 35L includes a semiconductor material, which can be an elemental semiconductor material (such as silicon or germanium), a compound semiconductor material (such as gallium arsenide or indium arsenide), or an alloy or a combination thereof. The sacrificial semiconductor material layer 35L can be deposited by a conformal deposition process such as chemical vapor deposition (CVD) or atomic layer deposition (ALD). The thickness of the sacrificial semiconductor material layer 35L can be in a range from 2 nm to 20 nm, although lesser and greater thicknesses can also be employed. The sacrificial semiconductor material layer 35L can be deposited as a polycrystalline semiconductor material layer (e.g., polysilicon) or as an amorphous semiconductor material layer (e.g., amorphous silicon).

Referring to FIG. 11, the exemplary structure is annealed at an elevated temperature to induce a reaction between the at least one metal of the metallic fill material portions 46B and the semiconductor material of the sacrificial semiconductor material layer 35L. The elevated temperature can be, for example, in a range from 500 degrees Celsius to 900 degrees Celsius, although lower and higher temperatures can also be employed. The anneal may comprise a rapid thermal anneal for 15 to 60 seconds.

A metal-semiconductor alloy region 46C is formed around each interface between a metallic fill material portion 46B and the sacrificial semiconductor material layer 35L. Each metal-semiconductor alloy region 46C includes an alloy of the at least one metal of the metallic fill material portions 46B and the semiconductor material of the sacrificial semiconductor material layer 35L. In one embodiment, the sacrificial semiconductor material layer 35L can include silicon, and the metal-semiconductor alloy regions 46C can include a metal silicide, such as a tungsten, tantalum, cobalt, nickel, titanium or another metal silicide. As a conductive structure, each metal-semiconductor alloy region 46C fills the recess 41 and region 46C is appended to (i.e., added to) the electrically conductive layer (46A, 46B) located at the same level. Thus, each electrically conductive layer (46A, 46B, 46C) located at a level of a lateral recess 41 can include a metallic liner 46A, a metallic fill material portion 46B, and a metal-semiconductor alloy region 46C adjacent to the cavity 49'.

Referring to FIG. 12, a selective etch that removes the semiconductor material of the sacrificial semiconductor material layer 35L selective to the metal-semiconductor alloy regions 46C and the insulator layers 32 can be employed to remove the unreacted portions of the sacrificial semiconductor material layer 35L. For example, a selective isotropic wet etch can be employed to remove the semiconductor material of the sacrificial semiconductor material layer 35L selective to the metal-semiconductor alloy regions 46C. Optionally, a wet clean may be subsequently performed to remove residual materials from the surfaces of the exemplary structure.

Optionally, the metal-semiconductor alloy regions 46C may be anisotropically etched such that the cavity 49' facing inner sidewalls of the metal-semiconductor alloy regions 46 are substantially planar and vertically coincident with sidewalls of the insulator layer 32 exposed in the cavity 49'. As used herein, a first surface and a second surface are vertically coincident if there exists a substantially vertical plane that includes the first surface and the second surface. As used herein, a plane is substantially vertical if the plane does not deviate from a vertical direction by more than 5 degrees.

Referring to FIG. 13, a sequential deposition of material layers can be employed to form the memory film (52L, 54L, 56) and an optional first semiconductor channel layer 601. Each memory film (52L, 54L, 56) can include a blocking dielectric layer 52L, a memory material layer 54L, and a tunneling dielectric 56. The blocking dielectric layer 52L can include a stack of a first blocking dielectric layer 52A and a second blocking dielectric layer 52B. In an illustrative example, the first blocking dielectric layer 52A can include a dielectric metal oxide layer such as an aluminum oxide layer, and the second blocking dielectric layer 52B can include a silicon oxide layer.

Each memory film (52L, 54L, 56) can be formed as a contiguous memory film on a substantially vertical sidewall of a memory opening 49. In one embodiment, the memory material layer 54L can comprises a charge trapping dielectric layer, such as a silicon nitride layer. The optional first semiconductor channel layer 601, if present, can be a first material portion employed to form a semiconductor channel 60 (See FIG. 1).

Referring to FIG. 14, a second exemplary memory opening according to a second embodiment of the present disclosure is illustrated after deposition of a metallic liner layer 46L1 and a metallic fill material layer 46L2, similar to that shown in FIG. 8. A lateral cavity 41C may be formed at each level of the lateral recesses 41 depending on the fill properties of the metallic fill material layer 46L2. Specifically, the imperfect conformity of the deposition process that deposits the metallic fill material layer 46L2 can induce seams at each level of the lateral recesses 41, and the opening of each seam can include a lateral cavity 41C. In other words, the lateral cavities 41C are not completely filled during deposition of layer 46L2. In an alternative embodiment, an isotropic etch, an anisotropic etch, or a combination of an anisotropic and isotropic etches may be performed after deposition of the metallic fill material layer 46L2 to form the lateral cavities 41C in addition to or instead of incompletely filling the lateral cavities 41C during deposition of layer 46L2.

Referring to FIG. 15, a sacrificial semiconductor material layer 35L can be deposited on the physically exposed surfaces of the metallic fill material layer 46L2. The sacrificial semiconductor material layer 35L can be deposited directly on the concave sidewalls of the electrically conductive layers 46L2. The sacrificial semiconductor material layer 35L includes a semiconductor material, which can be an elemental semiconductor material (such as silicon or germanium), a compound semiconductor material (such as gallium arsenide or indium arsenide), or an alloy or a combination thereof. The sacrificial semiconductor material layer 35L can be deposited by a conformal deposition process such as chemical vapor deposition (CVD) or atomic layer deposition (ALD). The thickness of the sacrificial semiconductor material layer 35L can be in a range from 2 nm to 20 nm, although lesser and greater thicknesses can also be employed. The sacrificial semiconductor material layer 35L can be deposited as a polycrystalline semiconductor material layer (e.g., polysilicon) or as an amorphous semiconductor material layer (e.g., amorphous silicon layer). The sacrificial semiconductor material layer 35L may, or may not, completely fill the lateral cavities 41C.

Referring to FIG. 16, the sacrificial semiconductor material layer 35L can be etched back, for example, by a selective etch to remove portions of the sacrificial semiconductor material layer 35L from above the alternating stack (32, 42A, 42B) and from inside the memory openings 49′. Remaining portions of the sacrificial semiconductor material layer 35L within the lateral cavities 41C constitute sacrificial semiconductor material portions 35. The duration of the etch of the sacrificial semiconductor material layer 35L is selected such that a sacrificial semiconductor material portion 35 remains on each concave sidewall of the metallic fill material portions 46B.

Referring to FIG. 17, a sacrificial metal layer 45L can be deposited on the sacrificial semiconductor material portions 35. The sacrificial metal layer 45L can be deposited directly on the concave sidewalls of the sacrificial semiconductor material portions 35. The sacrificial metal layer 45L includes a metal, which is herein referred to as a second metal. The second metal may be the same as, or different from, the first metal that is present in the metallic fill material portions 46B. For example, the first metal can be tungsten, and the second metal can be nickel, cobalt, titanium, or a combination thereof. In one embodiment, the sacrificial metal layer 45L can include a metal that forms a metal-semiconductor alloy at a lower reaction temperature with the semiconductor material of the sacrificial semiconductor material portions 35 than a metal-semiconductor reaction temperature of the at least one metal of the metallic fill material portion 46B with the semiconductor material of the sacrificial semiconductor material portions 35. The sacrificial metal layer 45L can be deposited by a conformal deposition process such as chemical vapor deposition (CVD) or atomic layer deposition (ALD). The thickness of the sacrificial metal layer 45L can be in a range from 2 nm to 20 nm, although lesser and greater thicknesses can also be employed. In one embodiment, the sacrificial metal layer 45L can be deposited directly on concave sidewalls of the sacrificial semiconductor material portions 35.

Referring to FIG. 18, the exemplary structure is annealed at an elevated temperature to induce a reaction between the second metal of the sacrificial metal layer 45L and the semiconductor material of the sacrificial semiconductor material portions 35 and optionally between the at least one metal of the metallic fill material portions 46B and the semiconductor material of the sacrificial semiconductor material layer 35L. The elevated temperature can be, for example, in a range from 500 degrees Celsius to 900 degrees Celsius, although lower and higher temperatures can also be employed. The anneal may be a rapid thermal anneal, for example.

A metal-semiconductor alloy region 46S is formed by reaction of the sacrificial semiconductor material portions 35 and the sacrificial metal layer 45L. Each metal-semiconductor alloy region 46S includes an alloy of the second metal and the semiconductor material of the sacrificial semiconductor material layer 35L, and optionally the at least one metal (including the first metal) of the metallic fill material portions 46B. In one embodiment, the sacrificial semiconductor material portions 35 can include silicon, and the metal-semiconductor alloy regions 46C can include a metal silicide. The metal silicide may comprise a cobalt silicide, nickel silicide, titanium silicide, etc., or a multi-metal silicide, such as tungsten-cobalt silicide, tungsten-nickel silicide, titanium-tungsten silicide, etc. As a conductive structure, each metal-semiconductor alloy region 46S is appended to (i.e., added to) the electrically conductive layer (46A, 46B) located at the same level. In one embodiment, each electrically conductive layer (46A, 46B) can be appended with a metal-semiconductor alloy region 46S comprising an alloy of at least one metal and a semiconductor material. The at least one metal of the metal-semiconductor alloy regions 46S can include one or both of the first metal and the second metal. Thus, each electrically conductive layer (46A, 46B, 46S) located at a level of a lateral recess 41 can include a metallic liner 46A, a metallic fill material portion 46B, and a metal-semiconductor alloy region 46S.

In one embodiment, the metal concentration within the metal-semiconductor alloy regions 46S can be homogenous, i.e., have the same composition throughout. In another embodiment, the metal-semiconductor alloy regions 46S may have a concentration gradient due to limited diffusion of the metallic elements from the sacrificial metal layer 45L and/or from the metallic fill material portions 46B. In one embodiment, each metal-semiconductor alloy region 46S can has a concentration gradient such that the concentration of the first metal decreases with a lateral distance from an interface with a respective metallic fill material portion 46B located at a same level, and the concentration of the second metal increases with the lateral distance from the interface with the respective metallic fill material portion 46B. In one embodiment, a metal-semiconductor alloy region 46S may comprise at least one metal of a metallic fill material portion 46B and further comprise at least one additional metal from a sacrificial metal layer 45L that is different from the at least one metal. For example, the silicide may have more tungsten than another metal (e.g., Co, Ni or Ti) adjacent to tungsten portion 46B and less tungsten than another metal adjacent to the cavity 49'.

Referring to FIG. 19, the unreacted portions of the sacrificial metal layer 45L can be removed selective to the metal-semiconductor alloy portions 46S. A wet etch can be employed to remove the unreacted portions of the sacrificial metal layer 45L selective to the metal-semiconductor alloy material of the metal-semiconductor alloy portions 46S.

Optionally, the metal-semiconductor alloy regions 46S may be anisotropically etched such that the inner sidewalls of the metal-semiconductor alloy regions 46 are vertically coincident with sidewalls of the insulator layer 32.

Figure 20:
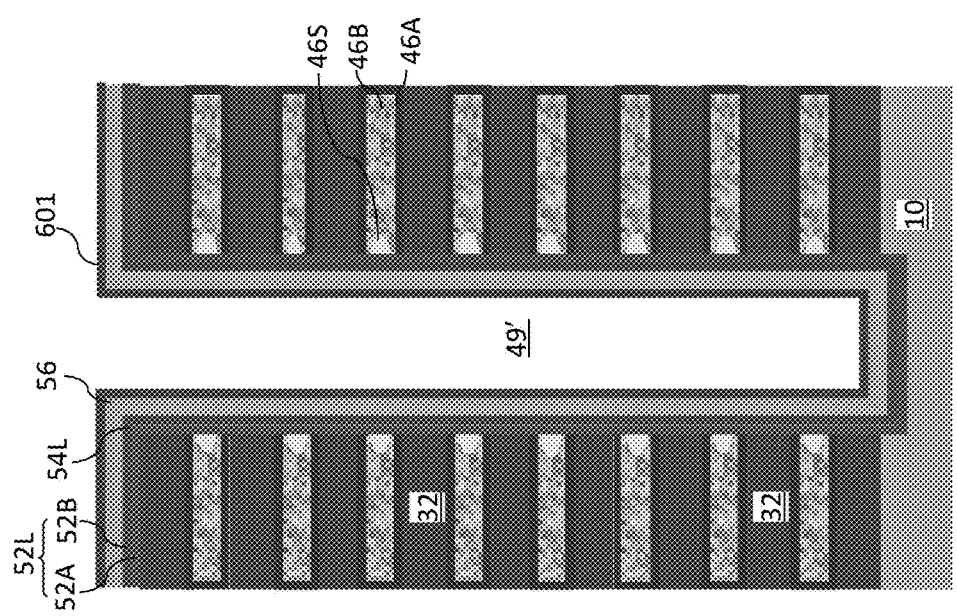
FIG. 20 is a vertical cross-sectional view of the second exemplary memory opening after deposition of material layers for memory films and a second semiconductor channel layer according to the embodiments of the present disclosure.

Referring to FIG. 20, the processing steps of FIG. 13 can be performed to deposit various material layers for formation of a memory film (52L, 54L, 56) and an optional first semiconductor channel layer 601.

In the above described first and second embodiments, the metal-semiconductor alloy regions (e.g., silicide regions) 46C or 46S are preferably located only on the inner side surface (i.e., vertical surface extending perpendicular to top surface 9 of the substrate 8) of the electrically conductive layers (i.e., control gate layers) 46 that face the memory stack structures 55 (i.e., the memory film 50 portions of the structures 55). Preferably, the opposing outer side surface and the top and bottom surfaces (i.e., the horizontal surfaces extending parallel to the top surface 9 of the substrate 8) of layers 46 do not include silicide regions.

Figure 21A:
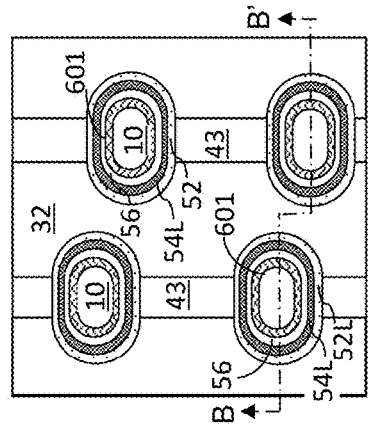
FIG. 21A is a top-down view of the array region of an exemplary device structure after formation of control gate electrodes and source-side select gate electrodes according to the embodiments of the present disclosure.
Figure 21B:
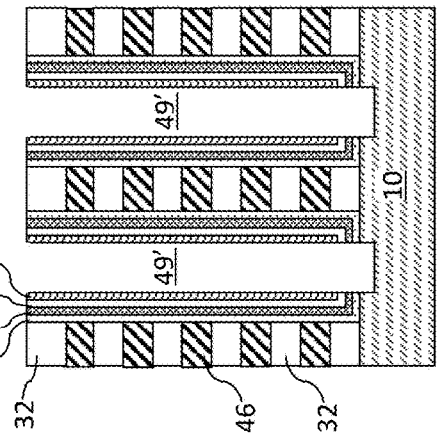
FIG. 21B is a vertical cross-sectional view of the exemplary device structure along the vertical plane B-B' of FIG. 21A.

Referring to FIGS. 21A and 21B, a cut-out portion of an array region of an exemplary device structure is illustrated during a processing step corresponding to FIG. 12 or FIG. 19. The electrically conductive layers 46 in FIGS. 21A and 21B may be the electrically conductive layers (46A, 46B, 46C) of FIG. 12, or may be the electrically conductive layers (46A, 46B, 46S) of FIG. 19.

Subsequently, the processing steps of FIG. 13 or FIG. 20 can be performed to the exemplary structure of the present disclosure (which may have instances of the device structures of FIG. 12 or the device structures of FIG. 19) to form a memory film containing layers 52L, 54L and 56 and an optional first semiconductor channel layer 601. The processing steps of FIG. 13 or the processing steps of FIG. 20 can be employed.

Figure 22A:
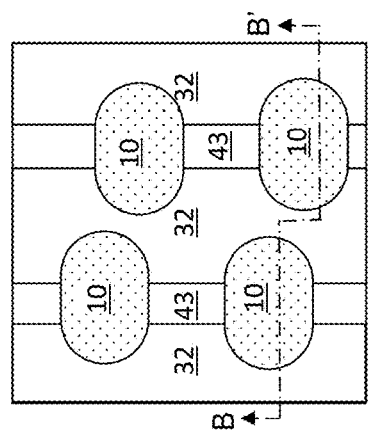
FIG. 22A is a horizontal cross-sectional view of the array region of the exemplary device structure after formation of blocking dielectrics, charge storage material layers, tunnel dielectrics, and a first semiconductor channel layer according to the embodiments of the present disclosure.
Figure 22B:
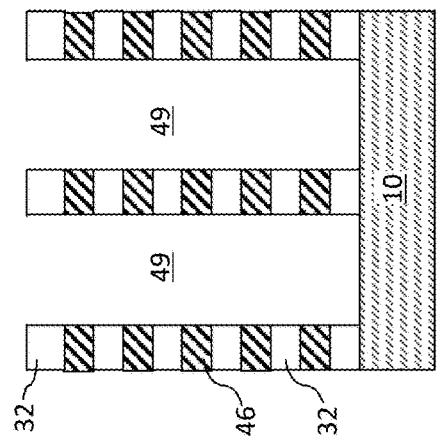
FIG. 22B is a vertical cross-sectional view of the exemplary device structure along the vertical plane B-B' of FIG. 22A. The plane A-A' corresponds to the horizontal cross-sectional plane of FIG. 22A.

Referring to FIGS. 22A and 22B, the optional first semiconductor channel layer 601, the tunneling dielectric 56, the memory material layer 54L, the at least one blocking dielectric layer 52L are sequentially anisotropically etched employing at least one anisotropic etch process. Each combination of remaining portions of the tunneling dielectric 56, the memory material layer 54L in a memory opening 49 constitutes a memory film 50. A top surface of the semiconductor material layer 10 is physically exposed at the bottom portion of each cavity 49', which is an unfilled portion of a memory opening 49.

Figure 23A:
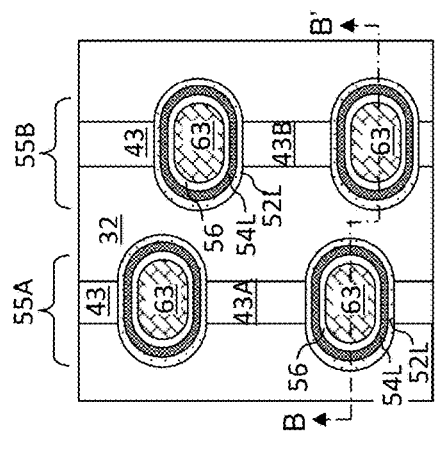
FIG. 23A is a horizontal cross-sectional view of the array region of the exemplary device structure after formation of a second semiconductor channel layer according to the embodiments of the present disclosure.
Figure 23B:
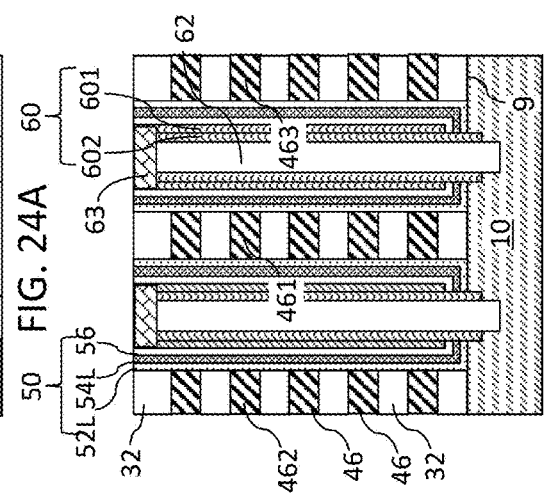
FIG. 23B is a vertical cross-sectional view of the exemplary device structure along the vertical plane B-B' of FIG. 23A. The plane A-A' corresponds to the horizontal cross-sectional plane of FIG. 23A.

Referring to FIGS. 23A and 23B, a second semiconductor channel layer 602 can be deposited on the semiconductor surface of the substrate 10, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening. The materials of the first semiconductor channel layer 601 and the second semiconductor channel layer 602 are collectively referred to as a semiconductor channel material. A memory stack structure 55 containing a semiconductor channel 60 and memory film 50 is formed in each of the plurality of memory openings and directly on inner sidewalls of the metal-semiconductor alloy regions (46C or 46S; see FIGS. 13 and 20).

Figure 24A:
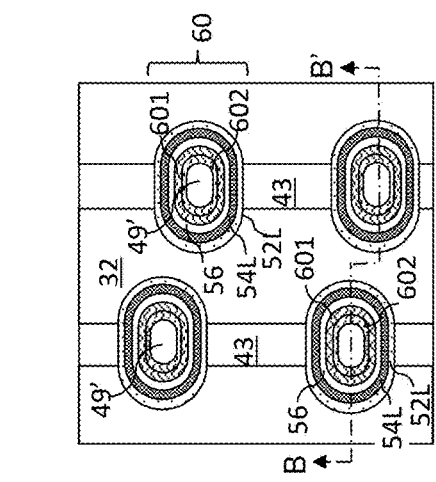
FIG. 24A is a top-down view of the array region of the exemplary device structure after formation of drain regions according to the embodiments of the present disclosure.
Figure 24B:
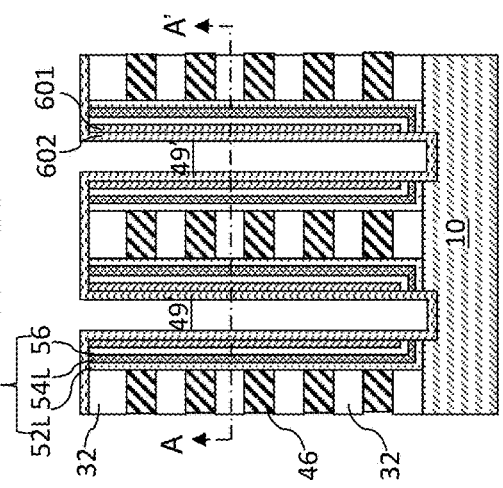
FIG. 24B is a vertical cross-sectional view of the exemplary device structure along the vertical plane B-B' of FIG. 24A.

Referring to FIGS. 24A and 24B, in case the cavity 49' in each memory opening is not completely filled by the second semiconductor channel layer 602, a dielectric core layer can be deposited to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch. Further, the horizontal portion of the second semiconductor channel layer 602 located above the alternating stack (32, 46) can be removed by a planarization process, which can employ a recess etch or chemical mechanical planarization (CMP). Each adjoining pair of a first semiconductor channel layer 601 and a second semiconductor channel layer 602 can collectively form a semiconductor channel 60 through which electrical current can flow when a vertical NAND device including the semiconductor channel 60 is turned on. A tunneling dielectric 56 is surrounded by a charge storage element 54L, and laterally surrounds a portion of the semiconductor channel 60. Each adjoining set of a blocking dielectric layer 52L, a memory material layer 54L, and a tunneling dielectric 56 collectively constitute a memory film 50. Each portion of the memory material layer 54L that is adjacent to an electrically conductive layer 46 constitutes a charge storage element or regions (e.g., memory element) that can store one bit of information.

The top surface of the remaining portion of the dielectric core layer can be further recessed within each memory opening, for example, by a recess etch. Each remaining portion of the dielectric core layer constitutes a dielectric core 62. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the alternating stack (32, 46), for example, by chemical mechanical planarization (CMP) or a recess etch to form the drain regions 63.

The exemplary device structure of FIGS. 24A and 24B can be incorporated into the exemplary device structure of FIG. 1 or derivatives therefrom. FIG. 25 illustrates the exemplary device structure upon such incorporation. Contact via structures 92 can be formed on each drain region 63, and bit lines 96 can be formed directly on the contact via structures 92 to access the drain regions 63. A semiconductor channel 60 can be formed in each memory opening over at least a portion of the pair of memory films 50. Source regions 61 can be formed by forming a source contact trench through the alternating stack (32, 42 or 46) and implanting electrical dopants of the second conductivity type. An insulating spacer 74 can be formed at the periphery of each source contact trench, and a source contact structure 76 can be formed in the remaining volume within each insulating spacer 74. The source contact structures 76 can provide electrical contact to the source regions 61.

Figure 26:
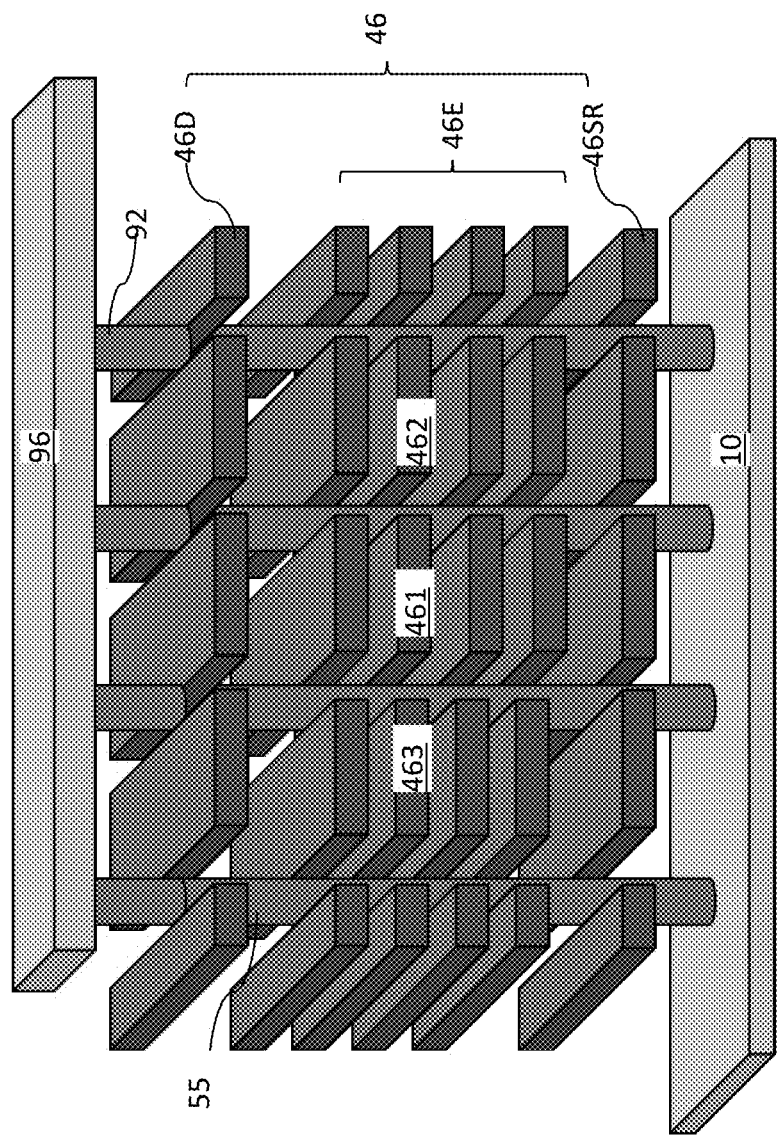
FIG. 26 is a perspective view of an array region of the exemplary device structure according to the embodiments of the present disclosure.

Referring to FIGS. 25 and 26, the exemplary structure can include a memory device, which comprises a stack of alternating layers comprising insulating layers 32 and electrically conductive layers 46 located over a substrate 8, a memory stack structure 55 located within a memory opening extending through the stack, and including semiconductor channel 60 having a vertical portion that extends along a direction perpendicular to a top surface of the substrate 8. Each of the electrically conductive layers 46 can include a metallic liner 46A contacting at least one of the insulating layers 32, a metallic fill material portion 46B surrounded by the metallic liner 46A and comprising at least one metal, and a metal-semiconductor alloy region (46C or 46S) comprising an alloy of the at least one metal and a semiconductor material and contacting sidewalls of the plurality of memory stack structures 50.

In one embodiment, each memory stack structure 55 may comprise multiple sets of at least two charge storage elements located around the semiconductor channel 60 at each level of the electrically conductive layers 46. Each set of at least two charge storage elements comprises charge storage elements that are located at the same level as a respective electrically conductive layer 46, and are electrically isolated from the semiconductor channel 60 by at least one respective tunneling dielectric 56, and from respective control gate electrodes (which are adjacent portions of the electrically conductive layers 46) thereof by at least one respective blocking dielectric 52. The electrically conductive layers 46 can comprise control gate electrodes 46E, source select gate electrodes 46SR, and drain select gate electrodes 46D. Each set of at least two charge storage elements on opposite sides of the channel 60 in the same device level are electrically isolated from each other because they are located in an insulating charge trapping layer 54L, such as a silicon nitride layer. Thus, portions of layer 54L in each device level adjacent to opposite control gate electrodes 46 constitute two charge storage elements of one memory cell, while the remaining portions of layer 54L in each device level adjacent to the separator insulator structures 43 constitute electrical isolation regions between the charge storage elements of the memory cell. Thus, each memory cell can store at least two bits of data (i.e., multi-bit memory cell).

The separator insulator structures 43 extend through the stack, contact portions of outer sidewalls of the memory stack structures 55, and laterally separate the control gate electrodes 46 of the plurality of charge storage elements (which are portions of the memory material layer 54L). The patterned electrically conductive layers 46 comprise control gate electrodes of the multiple sets of at least two charge storage elements. Each set of at least two charge storage elements comprises two regions within a respective memory material layer 54L that are adjacent to respective control gate electrodes and located at the same level. Separator insulator structures 43 can extend through the alternating stack (32, 46), contact sidewalls of the memory stack structure 55, and laterally separate the control gate electrodes 46E of the plurality of charge storage elements.

In one embodiment, an inner sidewall of the metal-semiconductor alloy region (46C or 46S) can be vertically coincident with a sidewall of the at least one of the insulating layers 32. In one embodiment, an outer sidewall of each metal-semiconductor alloy region 46C may be planar, and may contact a planar sidewall of a metallic fill material portion as illustrated in FIG. 13. In another embodiment, an outer sidewall of the metal-semiconductor alloy region 46S may be convex, and may contact a concave sidewall of the metallic fill material portion 46B as illustrated in FIG. 20.

A first row 155 and second row 255 of memory stack structures 55 extend through the respective first and second separator insulator structures (43A, 43B) as shown in FIG. 25. A continuous first control gate electrode 461 extends between the first 43A and the second 43B separator structures. Control gate electrode 461 is located adjacent to a first (right) side of the first separator structure 43A, adjacent to a first (right) side of the first row 155 of the memory stack structures, adjacent to a first (left) side of the second separator structure 43B, and adjacent to a first (left) side of the second row 255 of the memory stack structures.

A second control gate electrode 462 is located adjacent to a second (left) side of the first separator structure 43A, and adjacent to the second (left) side of the first row 155 of the memory stack structures. A third control gate electrode 463 is located adjacent to a second (right) side of the second row 255 of the memory stack structures, and adjacent to a second (right) side of the second separator structure 43B. Electrodes 462 and 463 may comprise finger portions of the same comb shaped word line 46B, while electrode 461 may comprise a finger portion of a different comb shaped word line 46A.

In one embodiment, each of the memory stack structures 55 can comprise a vertical stack of memory cells. Each memory cell can comprises a first charge storage element that can store one bit of information, and a second charge storage element that is electrically isolated from the first charge storage element and capable of storing another bit of information. The first charge storage element can be a first portion of the memory material layer 54L that adjoins a first control gate electrode (e.g., 461), and the second charge storage element can be a second portion of the memory material layer 54L that adjoins a second control gate electrode (e.g., 462) that is located at the same level as the first control gate electrode.

Separator insulator structures 43 can contact sidewalls of the plurality of memory stack structures 50. Each of the electrically conductive layers 46 can comprise a plurality of portions (e.g., 461, 462, 463) that are spaced from one another by the separator insulator structures 43.

The exemplary structure can further include drain regions 63 contacting an upper portion of each of the plurality of memory stack structures 50, and a source region 61 located on, or in, the substrate 8. A semiconductor channel can extends between each drain region 63 and the source region 61 through a respective memory stack structure 55. In one embodiment, each memory stack structure 55 can comprise, from outside to inside a memory film 50 and a semiconductor channel 60, where each memory film includes from outside to inside at least one blocking dielectric layer 52L, a memory material layer 54L, a tunneling dielectric 56 that contacts a semiconductor channel.

In one embodiment, the memory device can be a monolithic three-dimensional memory device that comprises a vertical NAND device located over the substrate 10. The electrically conductive layers 46 can comprise, or can be electrically connected to, a respective word line of the vertical NAND device. The substrate 10 can comprise a silicon substrate. The vertical NAND device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprise a plurality of semiconductor channels. At least one end portion of each of the plurality of semiconductor channels can extend substantially perpendicular to a top surface of the substrate 10. The array of monolithic three-dimensional NAND strings can further include a plurality of charge storage element, and a plurality of control gate electrodes having a strip shape extending substantially parallel to the top surface of the substrate 10. Each charge storage element can be located adjacent to a respective one of the plurality of semiconductor channels. The plurality of control gate electrodes can comprise at least a first control gate electrode located in the first device level and a second control gate electrode located in the second device level.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   a stack of alternating layers comprising insulating layers and electrically conductive layers and located over a substrate; and
   a plurality of memory stack structures extending through the stack;
   wherein each of the electrically conductive layers comprises a control gate electrode containing a first metal region comprising a first metal and further containing a metal-semiconductor alloy region comprising an alloy of the first metal and a semiconductor material and contacting sidewalls of a respective one of the plurality of memory stack structures.

2. The memory device of claim 1, wherein each control gate electrode further comprises
   a metallic liner contacting at least one of the insulating layers and a respective first metal region.

3. The memory device of claim 2, wherein:
   an inner sidewall of the metal-semiconductor alloy region is vertically coincident with a sidewall of the at least one of the insulating layers;
   the metal-semiconductor alloy regions are located only on an inner side surface of the electrically conductive layers that face the memory stack structures; and
   an opposing outer side surface and top and bottom surfaces of the electrically conductive layers do not include metal-semiconductor alloy regions.

4. The memory device of claim 2, wherein an outer sidewall of the metal-semiconductor alloy region is planar, and contacts a planar sidewall of the first metal region.

5. The memory device of claim 2, wherein an outer sidewall of the metal-semiconductor alloy region is convex, and contacts a concave sidewall of the first metal region.

6. The memory device of claim 2, wherein the metal-semiconductor alloy region further comprises a second metal that is different from the first metal.

7. The memory device of claim 6, wherein the metal-semiconductor alloy region has a concentration gradient such that:
   concentration of the first metal decreases with a lateral distance from an interface with the first metal region; and
   concentration of the second metal increases with the lateral distance from the interface with the first metal region.

8. The memory device of claim 1, wherein each of the memory stack structures comprises a vertical stack of memory cells, wherein each memory cell comprises:
   a first charge storage element located in a first device level adjacent to a first control gate electrode; and
   a second charge storage element located in the first device level adjacent to a second control gate electrode such that the second charge storage element is electrically isolated from the first charge storage element.

9. The memory device of claim 8, further comprising separator insulator structures contacting sidewalls of the plurality of memory stack structures, wherein each of the electrically conductive layers comprise a plurality of portions that are spaced from one another by the separator insulator structures.

10. The memory device of claim 2, wherein:
    the metallic liner comprises a material selected from a conductive metal nitride, a conductive metal carbide, and a stack including at least one conductive metal nitride and at least one conductive metal carbide;
    the first metal region comprises a material selected from tungsten, cobalt, ruthenium, copper, nickel, titanium, tantalum, and combinations thereof; and
    the metal-semiconductor alloy region comprises a metal silicide region.

11. The memory device of claim 1, further comprising:
    drain regions contacting an upper portion of each of the plurality of memory stack structures; and
    a source region located on, or in, the substrate,
    wherein:
    a semiconductor channel extends between each drain region and the source region through a respective memory stack structure;
    each memory stack structure comprises, from outside to inside, a memory film and the semiconductor channel, where each memory film includes from outside to inside:
    at least one blocking dielectric layer,
    a memory material layer, and
    a tunneling dielectric that contacts the semiconductor channel.

12. The memory device of claim 1, wherein:
the memory device is a monolithic three-dimensional memory device;
the monolithic three-dimensional memory device comprises a vertical NAND device located over the substrate;
the electrically conductive layers comprise, or are electrically connected to, a respective word line of the vertical NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

13. A method of forming a memory device, comprising:
forming a stack of alternating layers comprising insulating layers and sacrificial material layers over a substrate;
forming a plurality of memory openings through the stack;
replacing the sacrificial material layers with electrically conductive layers, each of the electrically conductive layers comprising a first metal region;
appending each electrically conductive layer with a metal-semiconductor alloy region, such that each of the electrically conductive layers comprises a control gate electrode containing a respective first metal region comprising a first metal and further containing a respective metal-semiconductor alloy region comprising an alloy of the first metal and a semiconductor material and contacting sidewalls of a respective one of the plurality of memory stack structures; and
forming a memory stack structure in each of the plurality of memory openings and directly on inner sidewalls of the metal-semiconductor alloy regions to form a plurality of memory stack structures extending through a stack of alternating layers comprising the insulating layers and the electrically conductive layers.

14. The method of claim 13, wherein each electrically conductive layer further comprises a metallic liner contacting at least one of the insulating layers and a respective first metal region, and the metal-semiconductor alloy region comprises a metal silicide region.

15. The method of claim 14, further comprising anisotropically etching the metal-semiconductor alloy regions prior to forming the memory stack structures, wherein inner sidewalls of the metal-semiconductor alloy regions and sidewalls of the insulating layers are vertically coincident.

16. The method of claim 14, further comprising:
depositing a sacrificial semiconductor material layer on the first metal regions;
inducing a reaction of the first metal regions and the sacrificial semiconductor material layer, wherein the metal-semiconductor alloy regions are formed; and
removing unreacted portions of the sacrificial semiconductor material layer.

17. The method of claim 16, wherein the first metal regions are formed with sidewalls that are laterally recessed relative to sidewalls of the insulating layers around each memory opening.

18. The method of claim 14, further comprising:
forming a sacrificial semiconductor material portion on each of the first metal regions;
forming a sacrificial metal layer on the sacrificial semiconductor material portions;
inducing a reaction between the sacrificial semiconductor material layer and at least the sacrificial metal layer, wherein the metal-semiconductor alloy regions are formed; and
removing unreacted portions of the sacrificial metal layer.

19. The method of claim 18, wherein:
the sacrificial metal layer comprises a second metal different from the first metal; and
each metal-semiconductor alloy region has a concentration gradient such that:
concentration of the first metal decreases with a lateral distance from an interface with a respective first metal region located at a same level; and
concentration of the second metal increases with the lateral distance from the interface with the respective first metal region.

20. The method of claim 14, further comprising:
forming lateral recesses by removing the sacrificial material layers;
filling the lateral recesses with a metallic liner layer and a metallic fill material layer; and
removing portions of the metallic liner layer and the metallic fill material layer from the memory openings, wherein remaining portions of the metallic liner layer and the metallic fill material layer constitute the metallic liners and the first metal regions.

21. The method of claim 20, wherein first metal regions are formed with concave sidewalls, and further comprising:
forming a sacrificial semiconductor material portion on each concave sidewall of the first metal regions; and
forming a sacrificial metal layer which is deposited directly on concave sidewalls of the sacrificial semiconductor material portions.

22. The method of claim 14, wherein each of the memory stack structures comprises a vertical stack of memory cells, wherein each memory cell comprises:
a first charge storage element; and
a second charge storage element that is electrically isolated from the first charge storage element.

23. The method of claim 14, further comprising forming separator insulator structures through the stack of alternating layers, wherein:
the plurality of memory openings are formed through the separator insulator structures; and the memory stack structures are formed on sidewalls of remaining portions of the separator insulator structures and on the silicide regions.

24. The method of claim 14, further comprising:

forming drain regions on the plurality of memory stack structures; and forming a source region on, or in, the substrate;

wherein:

a semiconductor channel extends between each drain region and the source region through a respective memory stack structure; and each memory stack structure comprises from outside to inside a memory film and a semiconductor channel, where each memory film includes from outside to inside:
- at least one blocking dielectric layer,
- a memory material layer, and
- a tunneling dielectric that contacts a semiconductor channel.

25. The method of claim 14, wherein:

the memory device is a monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in the first device level of the three-dimensional array of NAND strings is located over another memory cell in the second device level of the three-dimensional array of NAND strings;

the silicon substrate contains an integrated circuit comprising a driver circuit for the memory device located thereon; and each NAND string comprises:
- a semiconductor channels, wherein at least one end portion the semiconductor channel extends substantially perpendicular to a top surface of the silicon substrate;
- a plurality of charge storage elements, each charge storage element located adjacent to a respective semiconductor channel; and
- a plurality of control gate electrodes having a strip shape extending substantially parallel to the top surface of the substrate, the plurality of control gate electrodes comprise at least a first control gate electrode located in the first device level and a second control gate electrode located in the second device level.

\* \* \* \* \*